(12) United States Patent  (10) Patent No.: US 7,553,750 B2
Shih  (45) Date of Patent: Jun. 30, 2009

(54) METHOD FOR FABRICATING ELECTRICAL CONDUCTIVE STRUCTURE OF CIRCUIT BOARD

(75) Inventor: Chao Wen Shih, Hsin-chu (TW)

(73) Assignee: Phoenix Precision Technology Corporation, Hsin-chu (TW)

( * ) Notice: Subject to any disclaimer, the term of this patent is extended or adjusted under 35 U.S.C. 154(b) by 431 days.

(21) Appl. No.: 11/559,576

(22) Filed: Nov. 14, 2006

(65) Prior Publication Data

US 2007/0281389 A1    Dec. 6, 2007

(30) Foreign Application Priority Data

Jun. 1, 2006    (TW)    ............... 95119334 A

(51) Int. Cl.
    *H01L 21/44*    (2006.01)
(52) U.S. Cl. .................. 438/612; 438/614; 438/652; 257/E21.508
(58) Field of Classification Search ......... 438/612–614, 438/652–684, 685, 687; 257/E21.508
    See application file for complete search history.

(56) References Cited

U.S. PATENT DOCUMENTS 6,782,897 B2 *    8/2004    Wang et al. ................. 438/612

* cited by examiner

Primary Examiner—Thanhha Pham

(57) ABSTRACT

A method for fabricating an electrical conductive structure of a circuit board is disclosed. The method includes providing a circuit board having a plurality of first and second electrically conductive pads; forming on the circuit board an insulating protection layer having a plurality of openings for exposing the first and second electrically conductive pads; forming a metal adhesive layer on the first and second electrically conductive pads; forming a conductive layer on the insulating protection layer and on the metal adhesive layer formed on the first and second electrically conductive pads, the conductive layer being electrical conductive to the first and second electrically conductive pads; forming on the conductive layer a resist layer having a plurality of openings for exposing the conductive layer on the second electrically conductive pads; and electroplating a conductive structure on the conductive layer on the second electrically conductive pads exposed from the openings.

20 Claims, 5 Drawing Sheets

METHOD FOR FABRICATING ELECTRICAL CONDUCTIVE STRUCTURE OF CIRCUIT BOARD

BACKGROUND OF THE INVENTION

1. Field of the Invention

This invention relates to methods for fabricating an electrical conductive structure of a circuit board, and more particularly, to a method for fabricating an electrical conductive structure, which can be applied to the electrical conduction between two different electrically conductive pads and meets the requirement of fine pitch.

2. Description of Related Art

With the rapid development of electronic industry, modern electronic devices are designed to have compact size, high performance, multiple functions and fast operating speed. A flip chip semiconductor packaging technique is one of the most advanced semiconductor packaging techniques in the art. The flip chip semiconductor packaging technique includes forming solder bumps on the electrode pads of an integrated circuit (IC) chip, and forming solder bumps on a packaging substrate electrically conductive pads and the solder bumps are corresponding in position to each other, so as to dispose on the packaging substrate the IC chip with the active surface of the IC chip facing down.

Because more and more electric devices are required to have compact size, multiple functions and fast operating speed, the flip chip semiconductor packaging technique is widely applied to various fields, and has become a standard chip packaging technique. Moreover, in order to improve the electricity performance of the electric devices, varieties of passive components, such as resistors, capacitors and inductors, are disposed in the electric devices. The surface mounting devices such as the passive components are disposed on circuit boards by a surface mounting technology (SMT). There are a plurality of solder bumps and surface-mounting metal conductive components disposes on the circuit boards, solder materials of the solder bumps and surface-mounting metal conductive components having different sizes and heights for disposed different kind device. Therefore, the IC chip is electrical conductive to the solder bumps and the surface mounting device is electrical conductive to surface-mounting metal conductive components.

Chemical deposition and stencil printing technologies are two of the most popular techniques adopted in the art to form the solder materials on a substrate. As shown in FIG. 1A, an organic insulating protection layer 21, such as a solder mask, covers a circuit board 20 having a plurality of electrically conductive pads 201. The insulating protection layer 21 is formed by a patterning process and comprises a plurality of openings 211 for exposing the electrically conductive pads 201. As shown in FIG. 1B, a metal adhesive layer 22 is further formed on the electrically conductive pads 201 by sputtering, evaporating or electroless plating (or called chemical deposition processes). As shown in FIGS. 1C and 1D, a stencil 23 having a grid 23a is used to print on the metal adhesive layers 22 on part of the electrically conductive pads 201 of the circuit board 20 and form a solder material 24. As shown in FIG. 1E, a solder bump 24' is formed by the use of a re-flow process. Therefore, two different materials, i.e. the solder bump 24' and metal adhesive layers 22, are formed on the electrically conductive pads 201.

However, the higher the solder material 24 or solder bump 24' formed by the printing of the mold board 23 is, the more difficult the controlling of the height in succeeding processes becomes. In consequence, the re-flowed bumps and solder balls are not equal in height, and their electrical conduction to a chip or a printing circuit board is severely impacted. Moreover, the formation of the bumps and solder balls by printing the solder material on the electrically conductive pads of the circuit board easily causes too many solder materials to be melt, resulting in a bridging phenomenon (solder materials joined together at neighboring electrically conductive pads) and short problem and the failing of providing electrically conductive pads of fine pitches. Further, a great deal of the use of solder materials harms the environment.

Therefore, how to solve the above drawbacks is becoming one of the most urgent issues in the art.

SUMMARY OF THE INVENTION

In view of the above-mentioned problems of the prior art, it is a primary objective of the present invention to provide a method for fabricating an electrical conductive structure of a circuit board, which can be applied to the electrical conduction between two different electrically conductive pads.

It is another objective of the present invention to provide a method for fabricating an electrical conductive structure of a circuit board, which meets the requirement of fine pitch.

To achieve the above-mentioned and other objectives, a method for fabricating an electrical conductive structure of a circuit board is provided. The method includes providing a circuit board having a surface having a plurality of first and second electrically conductive pads; forming on the circuit board an insulating protection layer having a plurality of openings for exposing the first and second electrically conductive pads; forming a metal adhesive layer on the first and second electrically conductive pads; forming a conductive layer on the insulating protection layer and on the metal adhesive layer formed on the first and second electrically conductive pads, the conductive layer being electrical conductive to the first and second electrically conductive pads of the circuit board; forming on the conductive layer a resist layer having a plurality of openings for exposing the conductive layer on the second electrically conductive pads; and electroplating in the openings of the resist layer to successively form a metal post and a conductive structure on the conductive layer on the second electrically conductive pads.

The method further includes removing the resist layer and the conductive layer, so as to expose the metal adhesive on the first electrically conductive pads and the metal post and the conductive structure on the second electrically conductive pads.

After the resist layer and the conductive layer are removed, a re-flow process is performed on the conductive structure on the metal post of the first electrically conductive pads to form a solder bump.

The metal adhesive layer includes one selected from the group consisting of tin (Sn), gold (Au), silver (Ag), nickel/gold (Ni/Au), and nickel/palladium/gold (Ni/Pd/Au), and is formed by sputtering, evaporating or electroless plating (or called chemical deposition processes) on the first and second electrically conductive pads. Further, taking the conductive layer as a current transmission route, the method performs an electroplating process on the second electrically conductive pads to form the metal post and the conductive structure. After the resist layer and the conductive layer are removed, the metal adhesive layer is formed on the first electrically conductive pads, and the metal post and the conductive structure are formed on the second electrically conductive pads.

Both of the metal post and the conductive structure are formed on the second electrically conductive pads by an electroplating process. The metal post includes copper. The conductive structure includes at least one selected from the group consisting of tin, gold, silver, lead, zinc and bismuth.

Another embodiment of the present invention performs an electroplating process on the second electrically conductive pads directly to form the conductive structure, without the need to form the metal post. Therefore, the circuit board can meet different usage requirements for electrical conduction.

The metal adhesive layer is formed on the first electrically conductive pads by a chemical deposition process, for allowing the conduction of a surface-mounting device. The metal post and the conductive structure are formed on the second electrically conductive pads by the electroplating process so as to be electrical conductive to a semiconductor chip. Because the electroplating process takes exposing and developing steps to form the openings of the resist layer, so that the manufacturing bottleneck that a distance between any two bumps formed by the stencil printing technology of the prior art has to be restricted not longer than 150 μm is overcome. Moreover, the electroplating process has the capability to control the quantities of deposited solder material accurately, so that the bridging phenomenon resulting from the melting of too many solder material during the re-flow process is avoided, and an electrical conductive structure of fine pitch is formed.

BRIEF DESCRIPTION OF DRAWINGS

The invention can be more fully understood by reading the following detailed description of the preferred embodiments, with reference made to the accompanying drawings, wherein:

FIGS. 2A-1 to 2A-6 are top views of six types of electrically conductive pads of the electrical conductive structure shown in FIG. 2G.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

First Embodiment

Figure 1A:
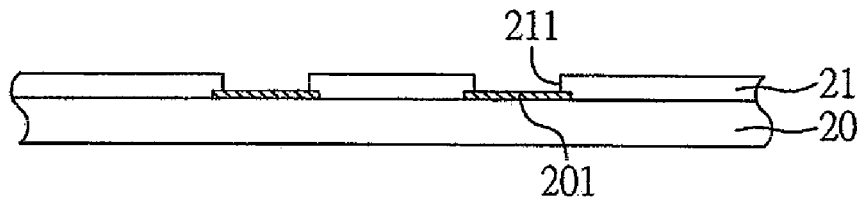
FIGS. 1A to 1E are five cross sectional views of a circuit board formed with a solder material of the prior art.
Figure 1B:
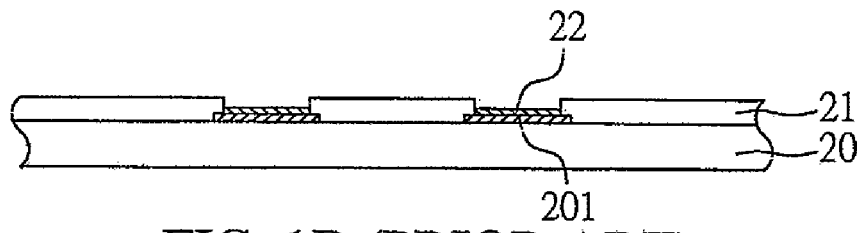
Figure 1C:
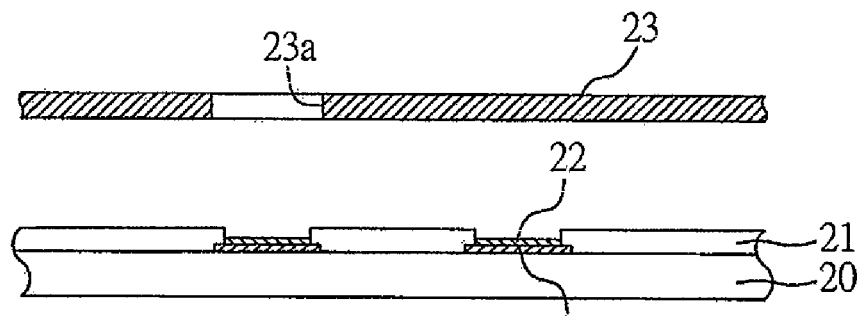
Figure 1D:
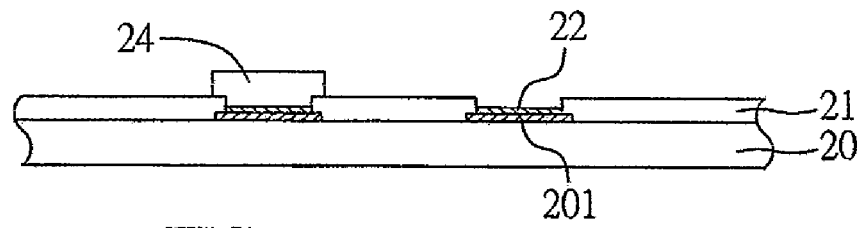
Figure 1E:
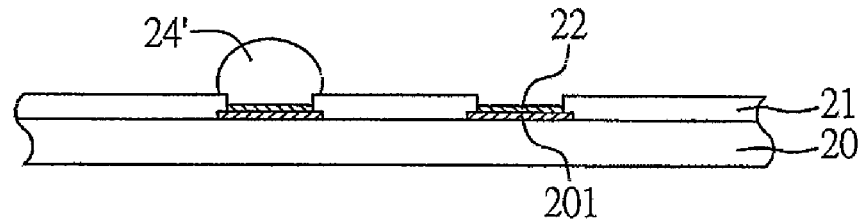
Figure 2A:
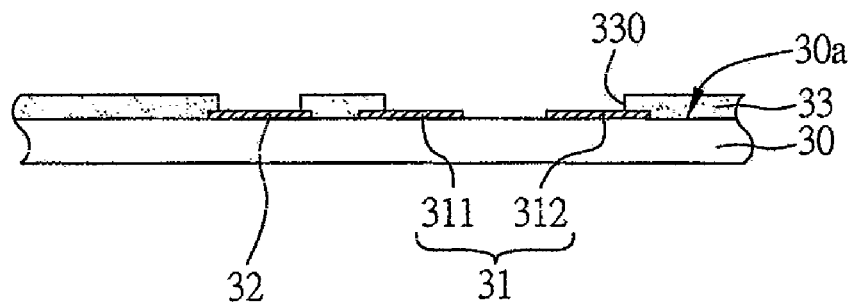
FIGS. 2A to 2G are seven cross sectional views of a circuit board having an electrical conductive structure fabricated by a method of a first embodiment according to the present invention.

FIGS. 2A to 2G are seven cross sectional views of a circuit board having an electrical conductive structure fabricated by a method of a first embodiment according to the present invention;

As shown in FIG. 2A, a double-layered or multi-layered circuit board 30 having a surface 30a is provided. A plurality of first electrically conductive pads 31 and second electrically conductive pads 32 are formed on the surface 30a. The first electrically conductive pads 31 comprise a plurality of paired electrically conductive pads 311, 312, both of which are disposed on the surface 30a of the circuit board 30. An insulating protection layer 33 such as a solder mask is further formed on the surface 30a of the circuit board 30. A plurality of openings 330 are formed on the insulating protection layer 33 for exposing the first electrically conductive pads 31 and second electrically conductive pads 32. The openings 330 of the insulating protection layer 33 are formed by a patterning process, such as exposing and developing process.

If the electrically conductive pads 31 are solder mask defined (SMD), the solder mask openings 330 are circular, rectangular or geometric, as shown in FIGS. 2A-1, 2A-2 and 2A-3. On the other hand, if the electrically conductive pads 31 are non-solder mask defined (NSMD), the solder mask openings 330 are circular, rectangular or geometric, as shown in FIGS. 2A-4, 2A-5 and 2A-6.

Figure 2B:
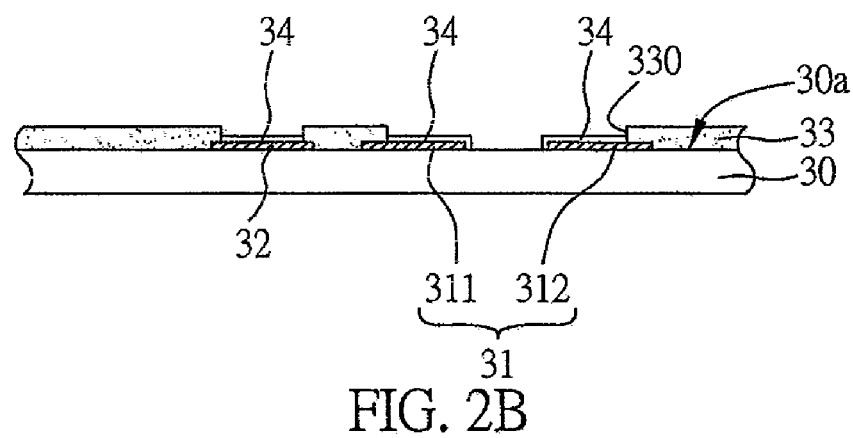

As shown in FIG. 2B, a metal adhesive layer 34 is further formed on the first electrically conductive pads 31 and second electrically conductive pads 32 by the sputtering, evaporating, or electroless plating (or called chemical deposition processes). According to the first embodiment, the metal adhesive layer 34 comprises Tin (Sn), gold (Au), silver (Ag), nickel/gold (Ni/Au), or nickel/palladium/gold (Ni/Pd/Au).

Figure 2C:
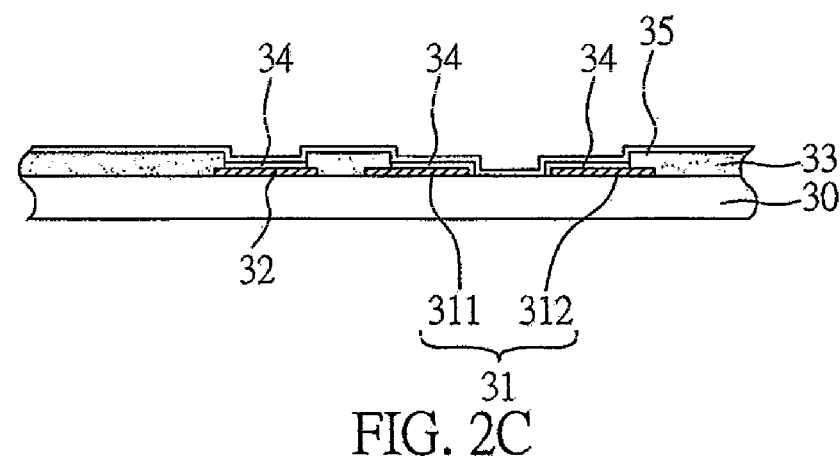

As shown in FIG. 2C, a conductive layer 35 is formed by the sputtering, evaporating or electroless plating (or called chemical deposition processes) on the insulating protection layer 33 and the metal adhesive layer 34. The conductive layer 35 is electrical conductive to the first electrically conductive pads 31 and second electrically conductive pads 32 of the circuit board 30.

Figure 2D:
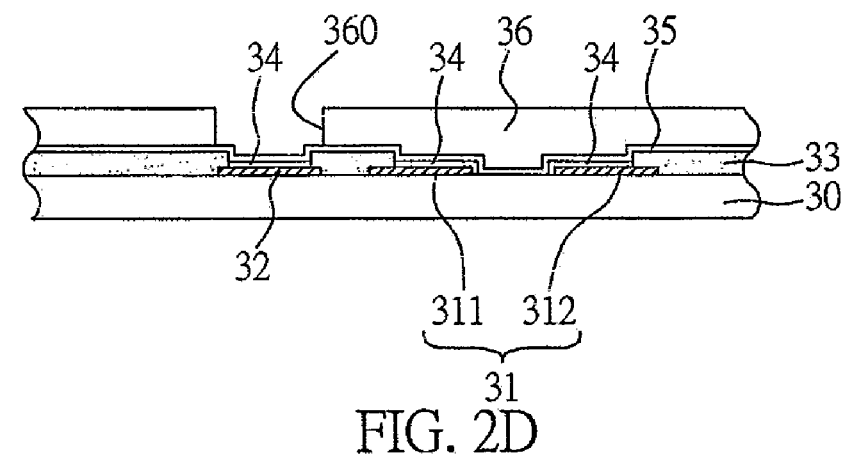

As shown in FIG. 2D, a resist layer 36 is formed on the conductive layer 35 and insulating protection layer 33 by laminating or coating techniques. A plurality of openings 360 are formed on the resist layer 36 for exposing the conductive layer 35 formed on the second electrically conductive pads 32.

Figure 2E:
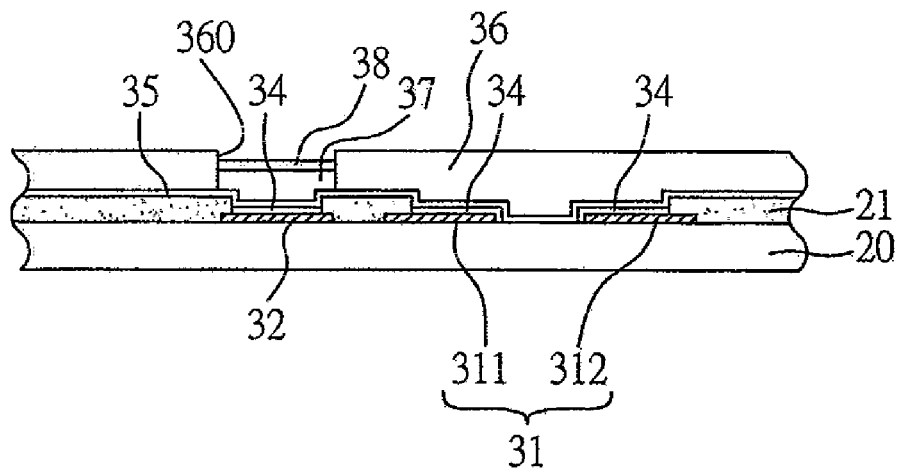

As shown in FIG. 2E, by the use of the conductive layer 35, which serves as a current transmission route, a metal post 37 and a conducive structure 38 are formed by an electroplating process on the conductive layer 35. According to the first embodiment, the metal post 37 comprises copper, and the conductive structure 38 comprises tin, silver, gold, zinc, lead, bismuth or an alloy of at least two of the former metal.

Figure 2F:
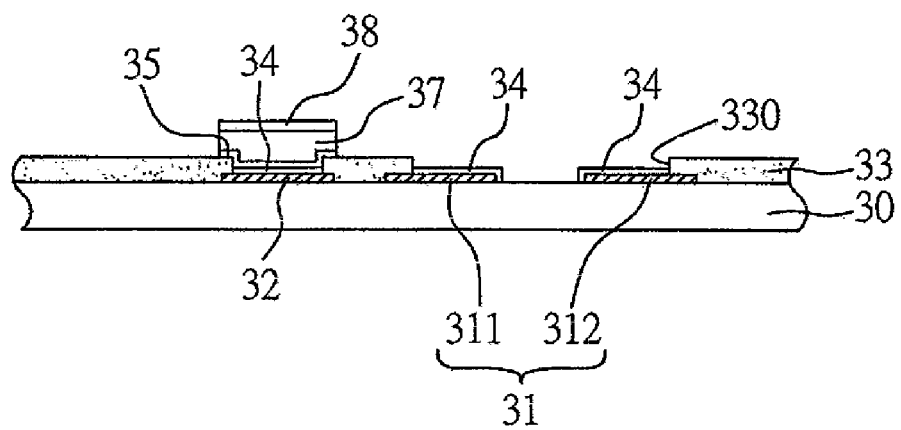

As shown in FIG. 2F, the resist layer 36 is removed by physical or chemical techniques, the conductive layer 35 is removed by a microetch technique, so as to expose the metal adhesive layer 34 on the first electrically conductive pads 31 and the metal post 37 and the conductive structure 38 on the second electrically conductive pads 32.

Figure 2G:
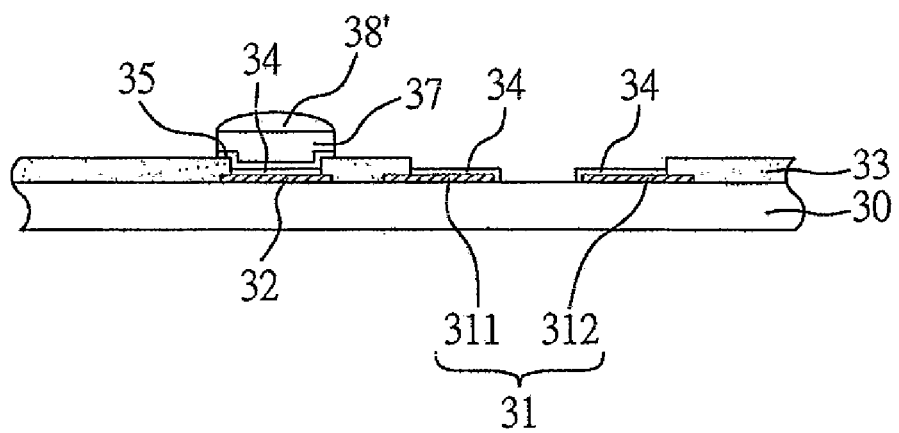
Figures 1, 2A:
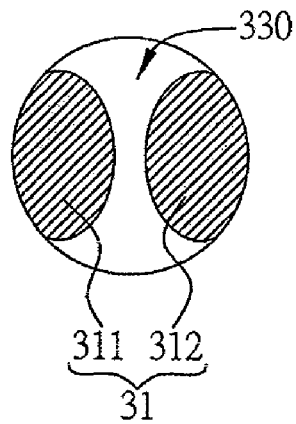
Figures 2, 2A, 3, 4:
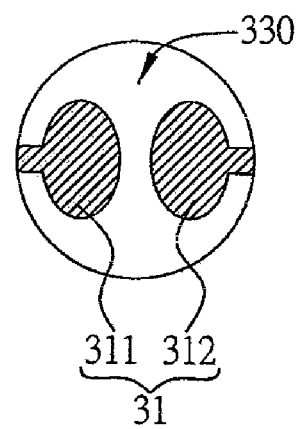
Figures 2, 2A:
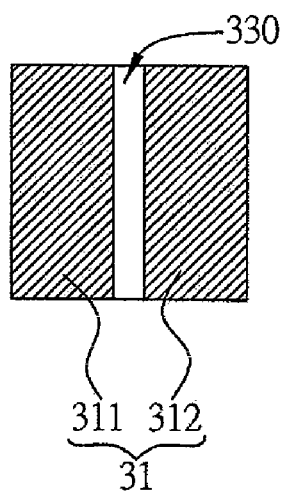
Figures 2, 2A, 3, 4, 5:
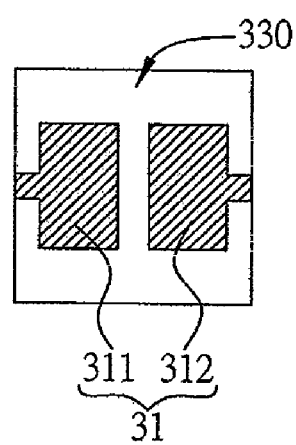
Figures 2, 2A, 3:
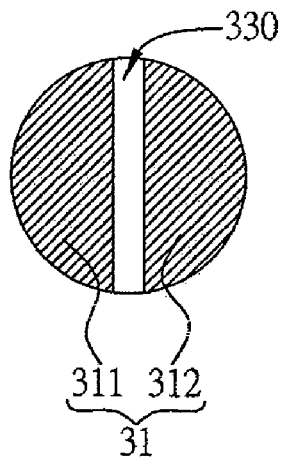
Figures 2, 2A, 3, 4, 5, 6:
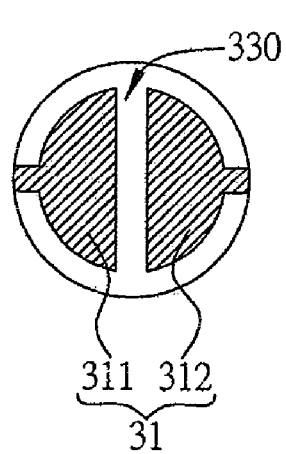

As shown in FIG. 2G, a re-flow process is performed on the conductive structure 38 to form a solder structure 38'.

Since the metal post 37 and the conductive structure 38 are both formed on the second electrically conductive pads 32 by the electroplating technique, and the metal adhesive layer 34 is formed on the first electrically conductive pads 31 by the chemical deposition process, an electrical conductive structure having two different materials can be formed on the first electrically conductive pads 31 and second electrically conductive pads 32. The metal adhesive layer 34 can be used for electrical conduction. The conductive structure 38, after re-flowed, becomes the solder bump 38', which is used as a conductive bump electrically conductive to a semiconductor chip. Therefore, two different electrical conductive structures, which are formed by two different techniques, meet different usage requirements for electrical conduction.

The method for fabricating an electrical conductive structure of a circuit board includes forming the metal adhesive layer on the first and second electrically conductive pads by the chemical deposition process, and forming the metal post and the conductive structure on the second electrically conductive pads by the electroplating technique, so as to form the metal adhesive layer on the first electrically conductive pads, form the metal post and the conductive structure on the second electrically conductive pads, and meet different usage requirements for electrical conduction. Moreover, since the metal adhesive layer is formed by the chemical deposition on the first electrically conductive pads, and the metal post and the conductive structure are formed by the electroplating process on the second electrically conductive pads, the manufacturing bottleneck of the stencil printing technology of the prior art is overcome, and an electrical conductive structure of fine pitch can be formed.

Second Embodiment

Figure 3A:
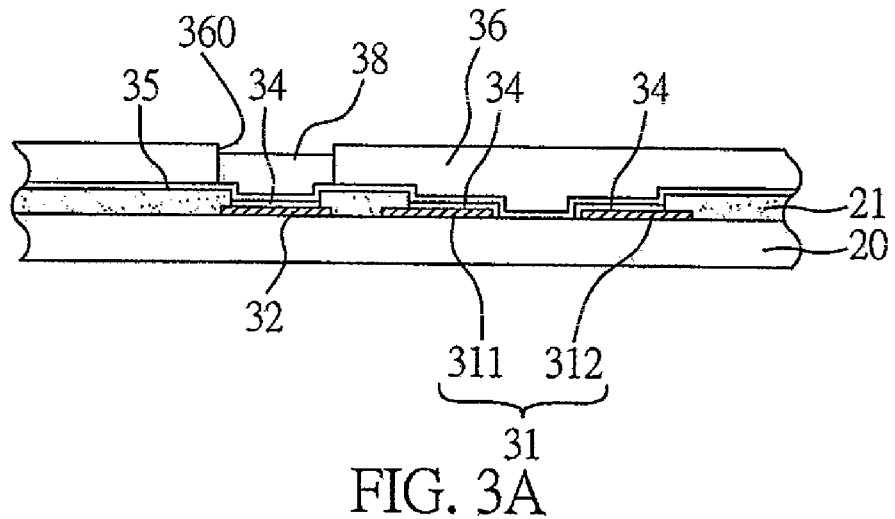
FIGS. 3A to 3C are three cross sectional views of a circuit board having an electrical conductive structure fabricated by a method of a second embodiment according to the present invention.
Figure 3B:
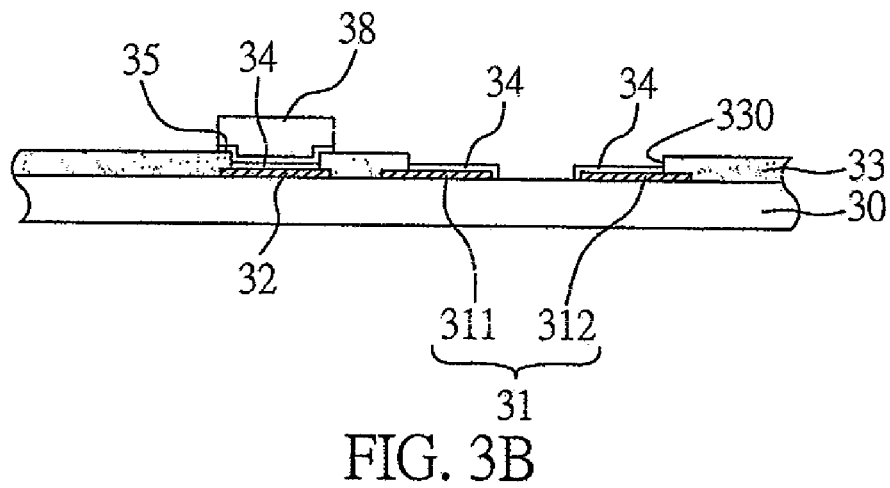
Figure 3C:
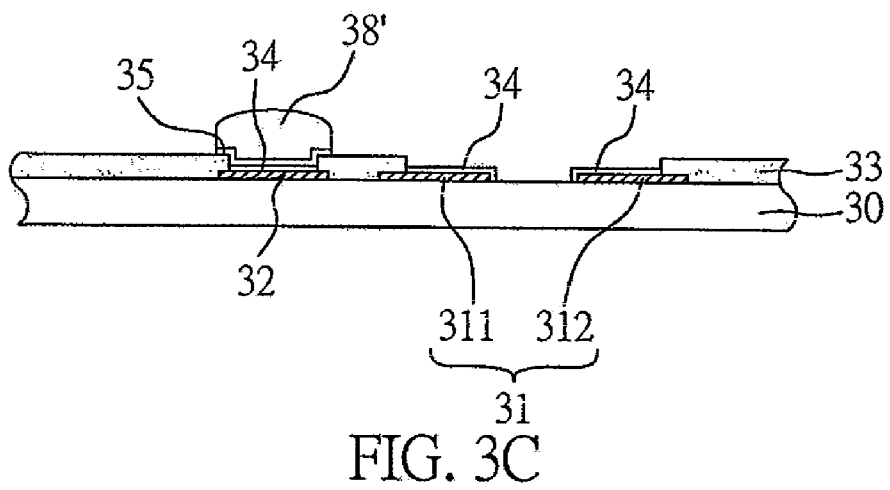

FIGS. 3A to 3C are three cross sectional views of a circuit board having an electrical conductive structure fabricated by a method of a second embodiment according to the present invention. Different from the first embodiment, the second embodiment has the second electrically conductive pads 32 be formed on the conductive structure 38 directly. The second embodiment follows the method shown in FIG. 2D, and components having the same functions have the same numerals.

As shown in FIG. 3A, the resist layer 36 is formed on the conductive layer 35 and insulating protection layer 33. The plurality of openings 360 are formed on the resist layer 36 for exposing the conductive layer 35 on the second electrically conductive pads 32. By the use of the conductive layer 35, which serves as the current transmission route, the conductive structure 38 is formed on the conductive layer 35 on the second electrically conductive pads 32 by the electroplating process.

As shown in FIG. 3B, the resist layer 36 and the conductive layer 35 are both removed, so as to expose the metal adhesive layer 34 on the first electrically conductive pads 31 and the conductive structure 38 of the second electrically conductive pads 32.

As shown in FIG. 3C, the re-flow process is performed on the conductive structure 38 to form a solder bump 38'.

The conductive structure 38 can be formed on the second electrically conductive pads 32 in accordance with the manufacturing and product requirements, to meet different usage requirements for electrical conduction.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method for fabricating an electrical conductive structure of a circuit board, the method comprising:
    providing a circuit board having a surface having a plurality of first and second electrically conductive pads;
    forming on the circuit board an insulating protection layer having a plurality of openings for exposing the first and second electrically conductive pads;
    forming a metal adhesive layer on the first and second electrically conductive pads;
    forming a conductive layer on the insulating protection layer and on the metal adhesive layer formed on the first and second electrically conductive pads, the conductive layer being electrical conductive to the first and second electrically conductive pads of the circuit board;
    forming on the conductive layer a resist layer having a plurality of openings for exposing the conductive layer on the second electrically conductive pads; and
    electroplating in the openings of the resist layer to form a conductive structure on the conductive layer on the second electrically conductive pads.

2. The method of claim 1 further comprising electroplating a metal post on the conductive layer on the second electrically conductive pads before forming the conductive structure by electroplating.

3. The method of claim 2, wherein the metal post comprises copper.

4. The method of claim 2 further comprising removing the resist layer and the conductive layer covered by the resist layer.

5. The method of claim 4, wherein the resist layer is removed by one selected from the group consisting of physical and chemical techniques.

6. The method of claim 4, wherein the conductive layer covered by the resist layer is removed by a microetch process.

7. The method of claim 2 further comprising performing a re-flow process on the conductive structure to form a solder bump.

8. The method of claim 1 further comprising removing the resist layer and the conductive layer covered by the resist layer.

9. The method of claim 8, wherein the resist layer is removed by one selected from the group consisting of physical and chemical techniques.

10. The method of claim 8, wherein the conductive layer covered by the resist layer is removed by a microetch process.

11. The method of claim 1 further comprising performing a re-flow process on the conductive structure to form a solder bump.

12. The method of claim 1, wherein the circuit board is one selected from the group consisting of a double-layered and multi-layered circuit board.

13. The method of claim 1, wherein the first electrically conductive pads are disposed in pairs on the circuit board.

14. The method of claim 1, wherein the metal adhesive layer is formed on the first and second electrically conductive pads by one selected from the group consisting of a sputtering, evaporating and electroless plating.

15. The method of claim 1, wherein the metal adhesive layer comprises at least one selected from the group consisting of tin (Sn), gold (Au), silver (Ag), nickel/gold (Ni/Au), and nickel/palladium/gold (Ni/Pd/Au).

16. The method of claim 1, wherein the resist layer is formed on the conductive layer by one selected from the group consisting of a laminating and coating process.

17. The method of claim 1, wherein the conductive structure comprises at least one selected from the group consisting of tin, gold, silver, bismuth, lead, zinc, and alloy thereof.

18. The method of claim 1, wherein the openings of the insulating protection layer for exposing the first and second electrically conductive pads are formed by one selected from the group consisting of solder mask defined (SMD) electrically conductive pads and non-solder mask defined (NSMD) electrically conductive pads.

19. The method of claim 18, wherein at least one of the openings of the insulating protection layer is in a shape of one selected from the group consisting of a circle, a rectangle, and a geometrical pattern.

20. The method of claim 1, wherein at least one of the openings of the insulating protection layer is in a shape of one selected from the group consisting of a circle, a rectangle, and a geometrical pattern.

* * * * *